April 18, 1961 J. R. MACDONALD 2,980,860

HALL EFFECT DEVICE

Filed Dec. 26, 1957 2 Sheets-Sheet 1

INVENTOR

James Ross Macdonald

BY Stevens, Davis, Miller & Mosher

ATTORNEYS

April 18, 1961 J. R. MACDONALD 2,980,860

HALL EFFECT DEVICE

Filed Dec. 26, 1957 2 Sheets-Sheet 2

INVENTOR
JAMES ROSS MACDONALD

BY *Stevens, Davis, Miller & Mosher*
ATTORNEYS

United States Patent Office 2,980,860

Patented Apr. 18, 1961

2,980,860

HALL EFFECT DEVICE

James Ross Macdonald, Dallas, Tex., assignor to Texas Instruments Incorporated, Dallas, Tex., a corporation of Delaware Filed Dec. 26, 1957, Ser. No. 705,380

11 Claims. (Cl. 330—6)

Figure 1:
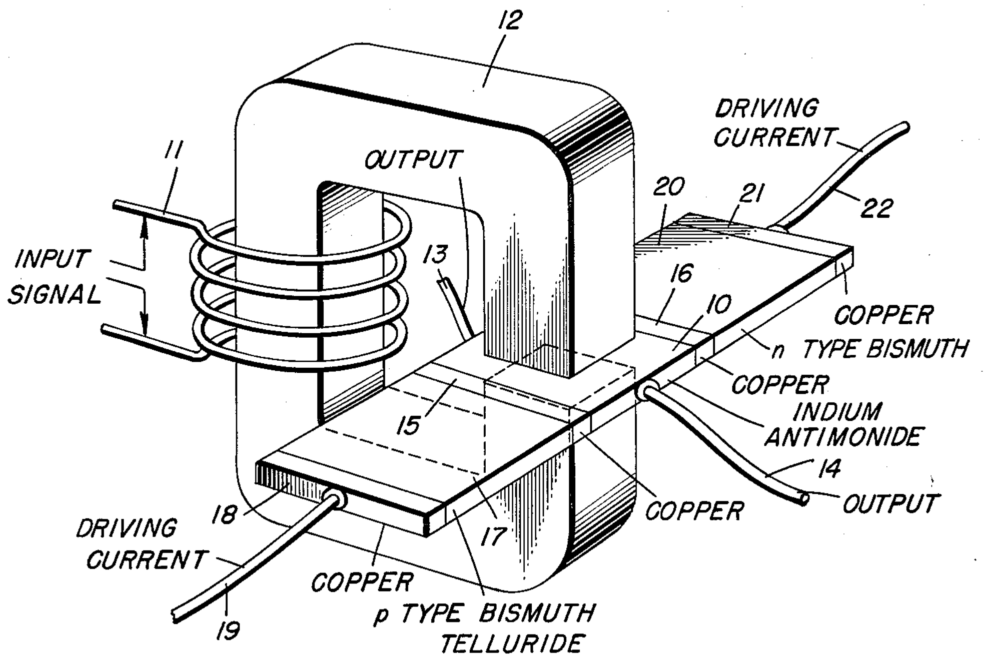

This invention relates to Hall effect amplifiers and, more particularly, to a method of cooling these amplifiers by the use of the same current that drives the device.

It is well known that if a current is passed through certain metals or alloys or other conducting materials in one direction, and these materials are subjected to magnetic flux at right angles or substantially right angles to the direction of passage of this current, that a secondary current will be generated in a direction substantially perpendicular to both the direction of the magnetic flux and the direction of passage of the driving current. If the driving current is maintained constant and the magnetic flux is varied, the output current will vary sufficiently so that the device can be used as an amplifier for a current which is used to produce the magnetic flux. Materials that work well in a Hall effect amplifier include indium antimonide (InSb), silicon and germanium. Other materials are known to be satisfactory for this purpose, however, and the present invention is not limited to those named.

One difficulty that has been encountered in the use of Hall effect amplifiers is the result of the fact that a relatively high current must be used as the driving current for the device and this high current tends to heat the Hall effect material through which it passes and thus impair the efficiency of the device and, at times, actually destroy the device. Complicated cooling arrangements involving the use of water or blowers can, of course, be utilized to lessen this difficulty but generally are undesirable. The present invention relates to a simpler, more effective method of cooling the block of Hall effect material that forms the nucleus of the device.

Briefly stated, the present invention comprises inserting at least one Peltier junction in the driving current circuit adjacent the block of Hall effect material and in such a position that it will serve to cool the Hall effect material.

A Peltier junction, as is well known, is an electrical junction between two electrically conducting materials, through which junction the flow of electrical current produces a cooling effect rather than the usual heating effect. Examples of such junctions are described in an article entitled "Cascading of Peltier Couples for Thermo-Electric Cooling," Journal of Applied Physics, vol. 27, No. 7, 820–823, July 19, 1956, and also in an article entitled "The Use of Semi-Conductors in Thermo-Electric Refrigeration," British Journal of Applied Physics, vol. 5, November 19, 1954, pp. 386–390. There are many combinations of materials that will function in Peltier junctions and these are well known in the art.

Numerous specific designs and configurations by which the cooling effect of a Peltier junction may be applied to the purpose of cooling the Hall effect material in a Hall amplifier are, of course, possible and these are believed to be within the scope of this invention. However, a thorough understanding of the principles of this invention and a further understanding of the advantages of it may be had by a consideration of the specific examples which are shown in the accompanying drawing and described hereinafter.

Figure 2:
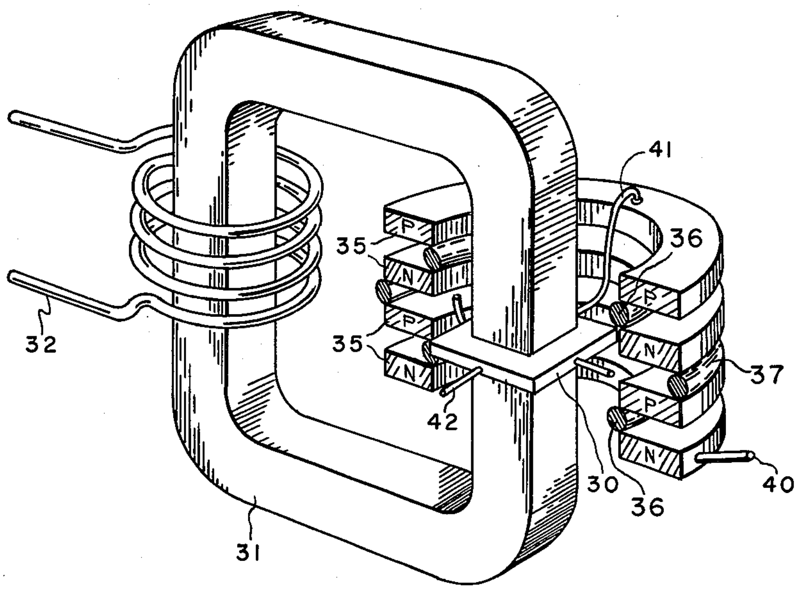

In the drawings:

Fig. 1 is a perspective view of a Hall effect amplifier constructed in accordance with the principles of this invention; and Fig. 2 is a perspective view of an alternative arrangement.

These showings are, to a certain extent, schematic in that no supporting structure is shown and the parts are portrayed in the way in which it is easiest to visualize them and their functions, and not necessarily in the exact way in which they will be embodied in a working device.

As illustrated in Fig. 1 of the drawings, the nucleus of the Hall effect device consists of a block 10 composed of indium antimonide, silicon, germanium, etc. arranged so that magnetic flux will pass up and down through the block, a driving current will pass horizontally through the block in one direction, and an output current will be taken horizontally from the block in a direction at 90° to the direction of the driving current. For purposes of discussion, block 10 will be considered indium antimonide. An electrical input signal is applied to a coil of wire 11 which surrounds a ring-shaped magnet core 12, usually of a high permeability material. This magnet core not only extends through the input signal coil 11 but also to the top and bottom of the block of Hall effect material 10 so that the flux generated in the magnet core is applied efficiently to the Hall effect material and the lines of flux extend substantially vertically therethrough. If core 12 is electrically conductive, the pole faces will have to be insulated from block 10 as by air gaps or dielectric coatings or sheets. On the other hand, if the pole faces of core 12 are not electrically conductive, for example, ferrite, then the pole faces can be in good contact with block 10. The output current is taken by means of any conventional type of ohmic contacts through a pair of electrical leads 13 and 14 extending from opposite sides of the Hall effect material block 10.

This brings us to the arrangement for supplying driving current to the block of Hall effect material 10 so that the driving current will pass through the block in a direction substantially perpendicular to the output current and also in a direction substantially perpendicular to the lines of flux of the magnet core 12. Prior to this invention, the driving current was simply supplied through ordinary contacts to the two remaining edges of the Hall effect material block 10. In accordance with the present invention, however, it is supplied to these remaining edges, but through Peltier junctions instead of ordinary contacts.

As illustrated in Fig. 1 of the drawings, and as preferred in the practice of this invention, the two remaining edges of the block 10 are covered with copper strips 15 and 16 which are welded in place by heating them until the indium antimonide softens and adheres to them, or are soldered in place by very soft solder. The usual fluxes may be used for making this connection. The copper strips serve as an electrical contact to the edges of the indium antimonide block and distribute the driving current over the width of the block.

Attached to the copper strip 15 is a block or strip 17 of p-type bismuth telluride ($Bi_2Te_3$). To the opposite end of the block or strip of bismuth telluride is affixed another copper strip 18 to which one of the driving current connections 19 is affixed. The block or strip of bismuth telluride may be fastened to the two copper strips by welding or soft solder in much the same manner that the copper strip was affixed to the indium antimonide. The driving current connection may, of course, be soldered in place or otherwise electrically attached.

On the opposite side of the Hall effect block 10, where the copper strip 16 is affixed in place in the same manner as the copper strip 15 already mentioned, a block of bismuth 20 is attached to the copper strip 16 and a second copper strip 21 is attached to the other end of the block of bismuth, and then a driving current connection 22 is attached thereto. Again, the bismuth may be attached to the copper strips by welding and soldering as already described for the other connections for the copper strips.

When the device is placed in operation with a rather considerable current passing through the driving current circuit in such a direction that heat is absorbed at the junctions between block 10 and blocks 17 and 20, a sizable cooling effect will be produced and this will tend to maintain the indium antimonide block 10 at a reasonably low temperature. Heat will, of course, be produced at the copper strips 18 and 21 but this heat can readily be dissipated and if necessary fins or other means may be provided at the copper strips 18 and 21 to dissipate this excess heat. The dimensions for the various strips and blocks are chosen so that strips 18 and 21 will be as far from block 10 as is practical.

It is considered desirable to provide a Peltier junction on each side of the indium antimonide block 10 for this produces even cooling within the block, but if desired only one Peltier junction may be provided and it can be on either side of the block. The connection on the opposite side of the block would be made directly to the driving current circuit. Thus, the bismuth telluride block could be eliminated or the bismuth block could be eliminated and the device would still operate and still be useful and desirable. Similarly, the copper strips 15 and 16 can be eliminated and bismuth telluride and bismuth welded or soldered directly to the indium antimonide and a useful device will still result. Rather obviously, the end strips of copper 18 and 21 may also be eliminated and the driving current connections made directly to the bismuth telluride or bismuth blocks.

Another modification that may be made in the construction of this invention consists in the use of two blocks of bismuth telluride instead of one block of bismuth telluride and the other block of bismuth. In this case, one of the blocks of bismuth telluride is made to have p-type conductivity and the other block is made to have n-type conductivity.

In cases where the bismuth telluride is to be welded directly to the indium antimonide, it is desirable that the two materials have the opposite types of conductivity. Thus, if the indium antimonide has a p-type conductivity the bismuth telluride should be made to have an n-type conductivity. These conductivity types may be governed by the addition of small amounts of impurities in a way well known to the semiconductor art.

While indium antimonide has been specifically stressed, the Hall effect material to be used in accordance with the preferred example, it is to be understood that many other types of material exhibit this same property and may be used for this same purpose. Similarly, Peltier junctions may be made with other materials than bismuth telluride and bismuth and the use of these other materials, which are known to the art, is considered to be within the scope of this invention.

An alternative arrangement is shown in Fig. 2. As before, a block 30 of Hall effect material is arranged in a plane perpendicular to a magnetic field established by a core 31 and winding 32. Leads 33 and 34 make ohmic contact to block 30 and constitute the output circuit.

A stack of annular members 35 are connected together alternately at their inner edges and outer edges. Inner connections are designated by the reference numeral 36, whereas the outer connection has been identified in the drawing by the reference numeral 37. Members 35 are composed of $Bi_2Te_3$ with the conductivity types being alternately p and n as designated. Any number of members 35 may be used. A lead 40 is attached to the bottom member 35 and a lead 41 is attached to the top member 35. Lead 41 is also attached to one side of block 30 and a lead 42 is attached to the opposite side of block 30. Thus, the driving circuit for block 30 includes lead 40, the stack of members 35, lead 41, block 30, and lead 42. The same current flowing through block 30 of Hall effect material passes through the stack of members 35 and is used to produce the cooling effect. The current is applied to the driving circuit in such a direction that heat is absorbed at the inside junctions and dissipated at the outside junction. By using the stack, a cold well is created surrounding the block 30. Various means can be used to take heat away from the outside junction, such as cooling fins or passing a cooling medium over the outside surface of the stack.

The structure and performance of a stack of members constituting composite Peltier junctions of $Bi_2Te_3$ is described in great detail in an article appearing in the Journal of Applied Physics, vol. 28, No. 9, September 1957, pages 1035–1042.

Although the present invention has been shown and described in terms of preferred embodiments, it will be appreciated that many changes and modifications are possible. Since it is undesirable to protract the discussion ad infinitum thoroughly describing all conceivable variations and changes, the disclosure will be terminated with the above description of the preferred embodiments with the proviso, however, that the invention be not interpreted and construed as limited to what has been specifically shown, but encompasses as well modifications obvious to skilled workers in this art from a knowledge of the concepts and teachings herein brought forth, and with the further understanding, of course, that such modifications come within the spirit and scope of the invention as delineated in the following claims.

What is claimed is:

1. In a Hall effect device, including a block of material in which the Hall effect can be produced, means to apply a magnetic field to said block, and means to flow driving current through said block at substantially right angles to said magnetic field, the improvement that comprises a stack of annular members electrically connected together alternately at their inner edges and outer edges to form a series of Peltier cooling junctions at their inner edges, said stack being positioned surrounding said block, and means connecting said series of Peltier junctions in the path of said driving current.

2. In a Hall effect device, as defined in claim 1 the further improvement of said annular members being composed of n and p type bismuth telluride.

3. In a Hall effect device, including a block of indium antimonide as the material in which the Hall effect is to be produced, means to apply a magnetic field to said block of indium antimonide, and means to flow driving current through said block of indium antimonide at substantially right angles to said magnetic field, the improvement that comprises a block of bismuth telluride attached to said block of indium antimonide to form therewith a Peltier junction in the path of said driving current.

4. In a Hall effect device, including a block of indium antimonide as the material in which the Hall effect is to be produced, means to apply a magnetic field to said block of indium antimonide, and means to flow driving current through said block of indium antimonide at substantially right angles to said magnetic field, the improvement that comprises a first block of bismuth telluride attached to one side of said block of indium antimonide and a second block of bismuth telluride attached to the opposite side of said block of indium antimonide, said blocks of bismuth telluride being of opposite conductivity so that two Peltier junctions are defined with said block of indium antimonide and being positioned to form said Peltier junctions in the path of said driving current.

5. In a Hall effect device, including a block of indium antimonide as the material in which the Hall effect is to be produced, means to apply a magnetic field to said block, and means to flow driving current through said block at substantially right angles to said magnetic field, the improvement that comprises a stack of annular members surrounding said block of indium antimonide, said stack of annular members defining a series of Peltier junctions having their cooling surfaces on the side of their annulus adjacent said Hall effect block, and means connecting said series of Peltier junctions in the path of said driving current.

6. In a Hall effect device, as defined in claim 5 the further improvement of adjacent members of said stack being composed of bismuth telluride of n type conductivity and bismuth telluride of p type conductivity.

7. In a Hall effect device including: a block of Hall effect material, means to supply a signal controlled magnetic flux perpendicularly through said block, means to pass an output current in one direction through said block and perpendicular to said flux and means to supply a driving current in a second direction through said block and perpendicular to both said flux and said one direction of current, the improvement of an integrally formed Peltier junction at each edge of said block adjacent the driving current means whereby the passage of said driving current through said block and junctions in said second direction will provide localized cooling of said block at the location of said transverse flux and currents.

8. In a Hall effect device, including a block of material in which the Hall effect can be produced, means to apply a magnetic field to said block, and means to flow driving current through said block at substantially right angles to said magnetic field, the improvement that comprises a body of dissimilar material attached to said block in series in the path of said driving current, said body of dissimilar materal coacting with said block for producing a Peltier junction that produces a cooling effect responsive to flow of driving current through said junction tending to offset the heating effect of said driving current as it flows in series through said block.

9. In a Hall effect device as in claim 8, the further improvement of said block being composed of indium antimonide.

10. In a Hall effect device, including a block of material in which the Hall effect can be produced, means to apply a magnetic field to said block, and means to flow driving current through said block at substantially right angles to said magnetic field, the improvement that comprises a body of dissimilar material attached to each end of said block in series in the path of said driving current, each said body of dissimilar material coactng with said block for producing a Peltier junction that produces a cooling effect responsive to flow of driving current through said junction tending to offset the heating effect of said driving current as it flows in series through said block.

11. In a Hall effect device as in claim 10, the further improvement of said block being composed of indium antimonide.

References Cited in the file of this patent

UNITED STATES PATENTS

| | | |
|---|---|---|
| 2,402,663 | Ohl | June 25, 1946 |
| 2,553,490 | Wallace | May 15, 1951 |
| 2,777,975 | Aigrain | Jan. 15, 1957 |
| 2,825,858 | Kuhrt | Mar. 4, 1958 |

OTHER REFERENCES

Publication: Westinghouse Engineer, May 1957, pages 71–73, "The Hall Effect and Its Uses" by Lawson, Jr.